Feb. 28, 1961 K. M. HAMMELL 2,973,499

SOCKET CONNECTOR MEANS FOR CIRCUIT BOARD

Filed March 12, 1958 2 Sheets-Sheet 1

INVENTOR.
Kemper M. Hammell
BY
Curtis, Morris & Safford
ATTORNEY

Feb. 28, 1961 K. M. HAMMELL 2,973,499

SOCKET CONNECTOR MEANS FOR CIRCUIT BOARD

Filed March 12, 1958 2 Sheets-Sheet 2

INVENTOR.
Kemper M. Hammell

BY

Curtis, Morris & Safford

ATTORNEY

United States Patent Office
2,973,499
Patented Feb. 28, 1961

2,973,499

SOCKET CONNECTOR MEANS FOR CIRCUIT BOARD

Kemper M. Hammell, Harrisburg, Pa., assignor to AMP Incorporated, Harrisburg, Pa.

Filed Mar. 12, 1958, Ser. No. 720,993
6 Claims. (Cl. 339—17)

This invention relates to improvements in connectors for a circuit board and, more particularly, in sockets for a circuit board to receive the leads or prongs of components to connect the same to circuits printed or otherwise formed upon the board.

Electrical circuit boards having circuits printed thereon are widely used for many purposes at present and comprise a panel of suitable electrical insulating material which may be molded, cast, or otherwise formed substantially into sheet-like form. A number of synthetic resins and other electrical insulating materials may be used for this purpose. Such boards are provided with so-called printed electrical circuits thereon which are applied to the board in various ways such as, for example, by electro-deposition or plating of a thin film of copper or the like upon the board, or pressing foil-type copper or other suitable metal against or into one or both surfaces of the board, various means being available for use to effect bonding between the metal foil and the board. Sockets may be formed in the board by drilling, punching, or by being molded therein to receive the leads or prongs of electrical components and it is necessary to effect an electrical connection between said leads or prongs and the electrical conductors extending along the insulating panel or board.

In such circuit boards, portions of the circuit members usually surround and sometimes extend into the socket openings in the board. To effect firm mechanical and electrical connection between such circuit conductors or projections thereof in the sockets and a component lead or projection inserted thereinto, it is essential at present to solder such connections. Such soldering frequently is accomplished by dipping a panel board, with the components positioned within the sockets thereof, into a bath of molten solder. The solder will adhere only to the metallic members and not to the exposed portion of the insulating panel board.

Such connections are not ideal for a number of reasons. The different temperature coefficients of the various elements in the connection result in high mechanical stresses and subsequent failure thus introducing questionable reliability over periods of time. Another serious difficulty arising from the use of such soldered connections comprises the problems encountered in replacing electrical components in such circuits. Such circuit boards frequently have components arranged thereon in close relationship and the sockets also are very close to each other. Thus, to melt the solder in a certain socket or pair of sockets, by a soldering iron, for example, to replace a component, comprises a tedious operation. The melting of the solder in one socket frequently will melt the solder in adjacent sockets of other components which are not to be replaced. Also, when it is necessary to remove a number of electrical components, to test them individually, the melting of a substantial number of soldered connections is required, followed by the re-soldering of the same when the components are replaced within the circuit or new ones are substituted therefor in the circuit. All of this is tedious and time consuming. This servicing or repairing also usually is done in the field after the electrical equipment is in use and the technical competence of the servicing personnel becomes an important factor. The circuit members per se frequently are relatively fragile and the mechanical bond holding them to the insulation panel is susceptible to excessive localized heat. Hence, a circuit board can be ruined beyond repair in attempting to remove or replace a soldered component lead if proper precautions are not observed.

The principal object of the present invention is to provide in a circuit board of the type described socket means which have socket openings molded therein, the construction of the socket affording a firm mechanical connection of substantial area between the circuit means within the socket and a lead or prong-like member of an electrical component which is of slightly greater diameter than the cross-sectional dimension of the socket. This is accomplished by providing a plurality of fingers extending transversely to the board from one surface thereof around the axis of the socket and connected to the board by hinge means integral with said board and fingers, means also being provided to urge the fingers into firm contact with such lead or prong member of an electrical component.

Another object of the invention is to provide, on such socket-forming fingers, hinge means of appreciable length and preferably thinner than the circuit panel board to afford substantial flexibility, said hinge means in the preferred embodiment extending above the surface of the board from which the fingers extend to increase the length of the hinges, thereby enhancing the flexibility and also affording somewhat of an accordion action which permits the fingers surrounding the socket to expand radially while remaining parallel to the lead or prong member engaged thereby.

A further object of the invention ancillary to the foregoing is to provide several embodiments of means engaging the fingers defining the socket to resist radial expansion of the fingers outwardly and to maintain the same firmly in substantially parallel engagement with a lead or prong member inserted into the socket, said resisting means being yieldable, whereby said socket can be expanded readily for purposes of receiving and mechanically engaging in parallel relationship such lead or prong of an electrical component of greater cross-sectional dimension than the socket.

Still another object of the invention is to provide bracing means in the form of ribs upon said fingers to prevent bending of the same and thereby insure parallel engagement of the interior surfaces of the fingers with a lead or prong member of an electrical component, including the circuit means provided upon such interior surfaces of said fingers.

Details of the foregoing objects and of the invention, as well as other objects thereof, are set forth in the following specification and illustrated in the accompanying drawing comprising a part thereof.

Figures 8, 9:
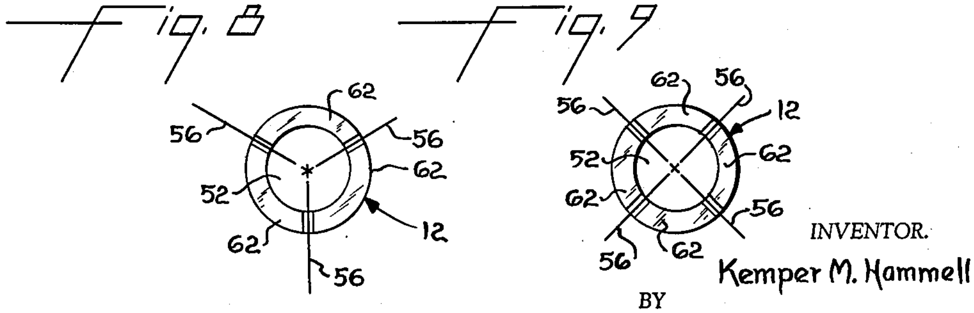

Figures 8 and 9 respectively are diagrammatic end views of a socket illustrating different patterns for slotting the socket to form the fingers defining the same.

Figure 1:
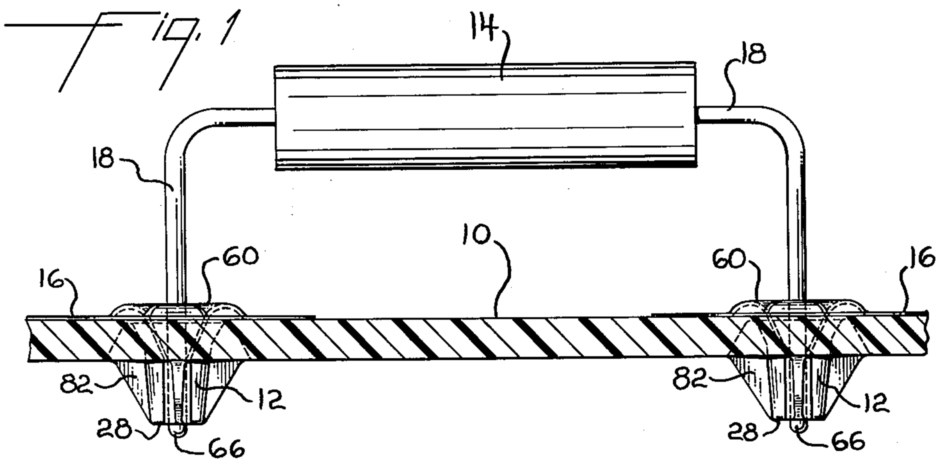
Figure 1 is an exemplary vertical elevation of a section of circuit panel board having a circuit thereon shown fragmentarily in cross-section and sockets being provided on the panel board, an exemplary electrical component being mounted with the leads thereof received within said sockets in accordance with the principles of the present invention.
Figures 2, 3:
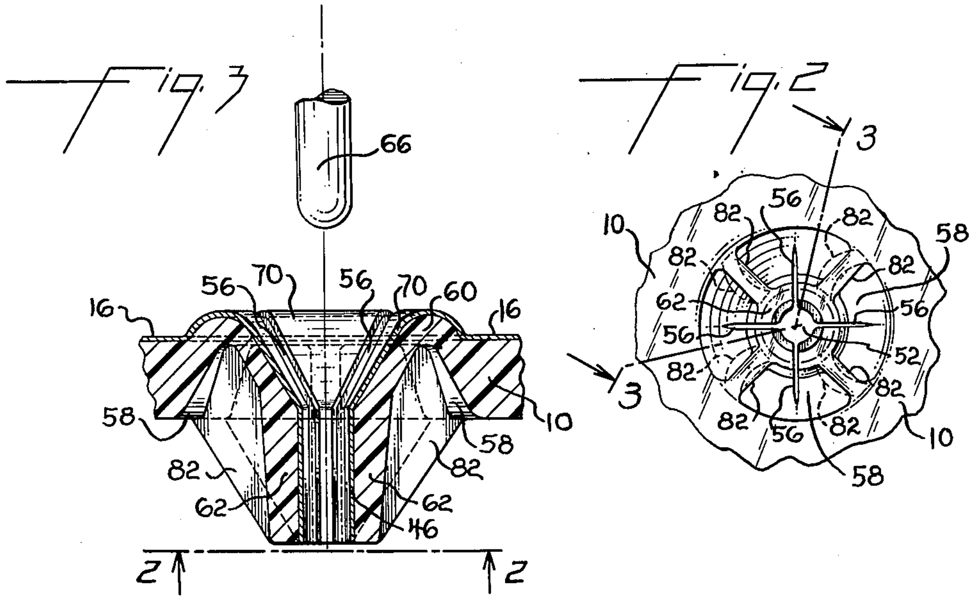
Figure 2 is a fragmentary bottom plan view on a slightly enlarged scale of a portion of the circuit board including a socket as shown in Figure 1, but without a component lead, the dotted lines indicating the compressed position of constricting means for the fingers of the socket upon a lead or prong member being inserted.
Figure 3 is a sectional view taken along lines 3—3 of Figure 2, but on a slightly enlarged scale.

Referring to Figures 1–3 there is shown a section of an exemplary circuit panel board 10 having integral boss-like projections 12 extending from one surface thereof at desired positions where connections are to be made between an electrical component 14, for example, and metallic circuit conductors 16. It is to be understood, of course, that any of a variety of techniques known in the art may be employed to shape the circuit board and projections as shown, for example by molding or casting from suitable plastics or synthetic resins of either thermosetting or thermoplastic types, so as to form a board which is relatively stiff but having sufficient flexibility and resilience for the purposes to be described. The prong-like member such as the lead 18 of the exemplary component 14 is of slightly greater cross-sectional dimension than the socket openings formed within the boss-like projections 12 and are inserted axially into said socket openings. The cross-sectional shape of the members 18 and socket openings preferably are complementary.

Figures 4, 5, 6, 7:
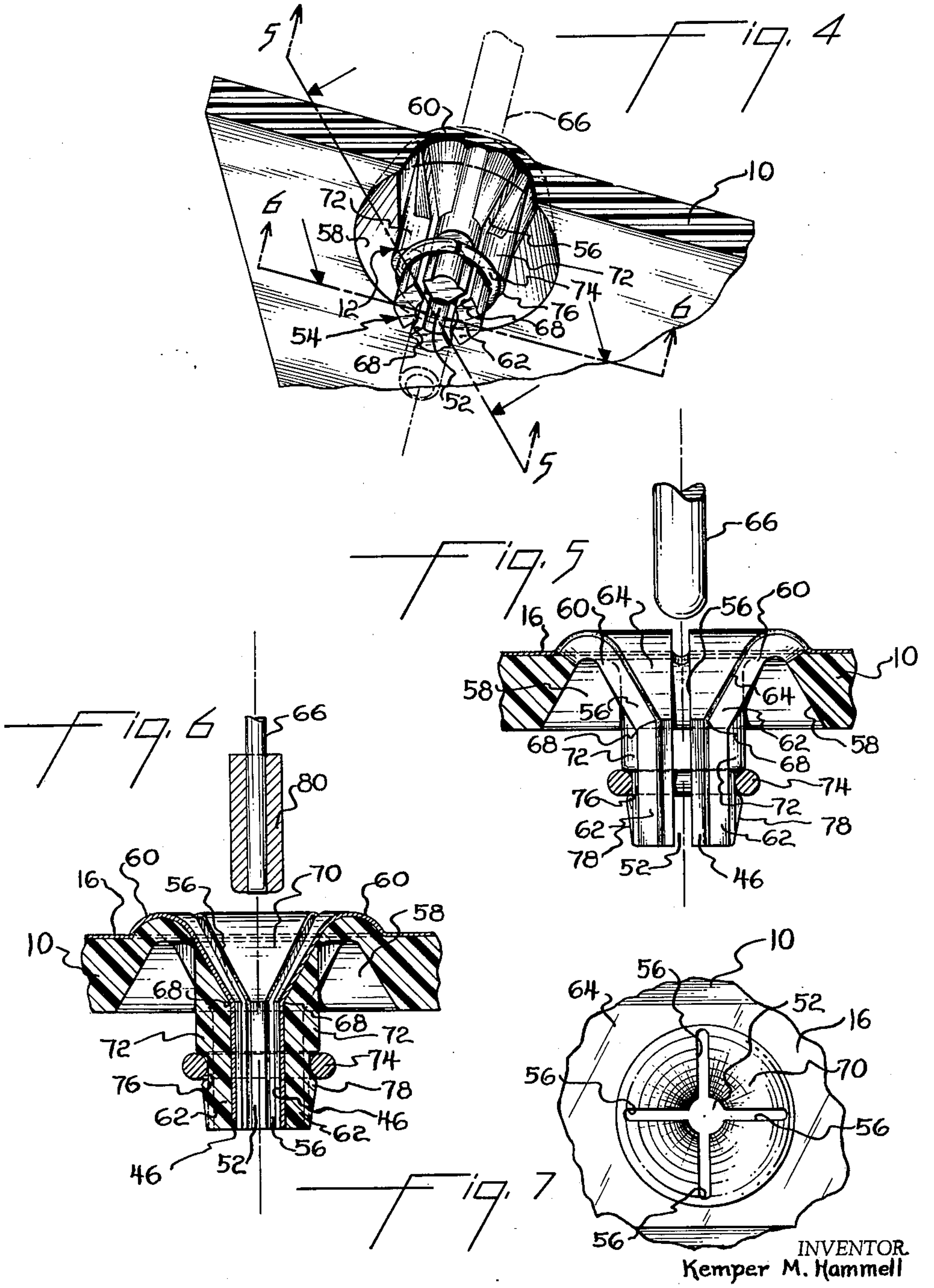
Figure 4 is an enlarged fragmentary perspective view of another embodiment of a panel board as viewed from the lower end of a socket and illustrating hinge means for the fingers defining the socket.
Figure 5 is a transverse sectional view through the socket of Figure 4 taken on lines 5—5 of Figure 4, but on a slightly enlarged scale.
Figure 6 is a transverse sectional view similar to Figure 5 but taken on lines 6—6 of Figure 4.
Figure 7 is a fragmentary top plan view of the socket of Figure 4, showing an exemplary embodiment of the entrance end thereof and a portion of the circuit means formed upon the panel board.

The metallic circuit conductors 16 are applied or affixed to the board 10 by any suitable means. In the exemplary illustration shown herein, it is assumed that the circuit conductors 16 are of relatively thin sheet metal, such as copper foil, and have been affixed to the board suitably to retain the same connected thereto in all conditions of use. Further, a funnel shaped portion 70 of the metallic circuit conductors 16 has been illustrated as being shaped to conform and adhere to the interior of the socket openings 52 and entrance 64 (Figure 7). Such formation can be obtained by plating the circuit into the socket or by a suitable forming of the portion of the metallic circuit conductors 16 which, for example, extend across the socket.

It also is to be understood that the leads 18 are merely exemplary of prong-like means which may be inserted within the sleeve-like sockets 52. Further, the dimension of the interior of the socket 52 which is formed within each boss-like projection 12, is selected so that, particularly when the metallic extensions of conductor 16 are disposed into the interior of the socket 52, firm mechanical connection will be established between the prong-like member 18 and the interior of sockets.

Although the illustrations in Figures 1–3 show one exemplary manner by which the funnel shaped portions 70 and extensions 46 of conductor 16 may be formed, it will be understood that mechanical connection may be effected between the prong-like member 18 and the metallic circuit conductors 16 when, for example, a single ribbon-like extension 46 of the conductor 16 extends axially into the socket 52, such extension being placed there by a suitable punch or shaping tool and affixed by cement or the like, or electro-deposited therein. When a prong-like insertable member, such as lead 18, is physically inserted by pushing into socket 52, sufficient mechanical and electrical connection will be established as to render unnecessary conventional soldering as is now substantially universally required in the connection of electrical components to conventional circuit panel boards.

The component 14 is merely exemplary of a wide variety of electrical components which may be connected to a circuit panel board, preferably of the so-called printed circuit type. Such components for example may comprise a condensor, resistor, coil, or any one of a substantial number of similar components. In addition, it is intended that the leads 18 are representative of prongs of the type for example connected to vacuum tubes of various kinds, said prongs usually being arranged in a circular pattern and projecting from one end of such vacuum tubes. Under such circumstances, a complementary pattern of sockets 52 will be provided, the same having extensions 46 of circuit conductors 16 disposed within and fixed to the interior of the sockets 52.

The slightly greater cross-sectional dimension or diameter of the members 18, when inserted into the sleeve-like socket 52, will cause the socket walls to expand. To facilitate such expansion, the spud-like projections 12 preferably are each provided with one or more axially extending, radial slots 56 which preferably extend from the outer end of the boss toward and into the panel board 10. Such slots result in the formation of a plurality of fingers 62, the inner surfaces of which define the socket walls. Figures 8 and 9 show, in diagrammatic form, several practical exemplary slot arrangements to provide a plurality of fingers 62, but these are not to be regarded as restrictive.

Turning now to the other illustrated embodiment, Figures 4–7, the fingers 62 of the socket means are connected to the board 10 by hinge means molded integrally with said board and fingers from the same material. In these figures, a fragmentary portion of panel 10 is shown with a single spud-like projection formed thereon. It will be understood that board 10 may be molded to have as many such projections and sockets therein as desired. Surrounding the spud-like boss 54 is an annular, conical recess 58 which extends upwardly into board 10 to provide an annular series of hinge means 60 which are substantially U-shaped and by which the upper ends of the fingers 62 between slots 56 are connected yieldably to board 10. The recess 58 renders the hinge means 60 thinner than board 10 as readily shown in Figures 5 and 6.

The flared entrance end of socket opening 52 cooperates with recess 58 to provide hinges of substantial length and also facilitates the insertion thereinto of a prong-like member 66 of an electrical component of greater cross-sectional dimension than the socket opening. The flared entrance 64 is lined with the metallic funnel shaped portions 70 comprising part of circuit member 16 and meets circuit extensions 46 at the corners 68, all of the metal preferably being integral.

To further enhance the tight gripping of member 66 by the walls of socket opening 52 including the circuit means of the interior thereof, the fingers 62 preferably are reinforced by ribs 72 which extend longitudinally thereof on the exterior, whereby they may be formed readily by molding, thus providing stiffness for the fingers. Also, it will be seen from Figures 5 and 6 particularly that the hinge means 60 formed by slots 56 are relatively long and are curved upwardly above the upper surface of board 10 and then extend downward into connection with fingers 62, thereby being somewhat U-shaped. This arrangement affords a compound hinge action which affords a limited accordion action and results in the establishment of longitudinal parallel abutting engagement between member 66 and the circuit extensions 46 on the interior of fingers 62 defining socket 52. Should the lead 66 be too small in diameter to permit ready molding of sockets of the types described hereinabove, such leads or prongs may be increased in diameter inexpensively by crimping a conductive ferrule to the lead or prong 66 and thus provide an enlargement 80 as shown in Figure 6.

Snug engagement of the fingers 62 with the lead or prong members 66 is assured by constricting means, one embodiment of which comprises a resilient snap ring 74 which surrounds such fingers preferably intermediately of the ends thereof. If desired, the ring 74 may be retained upon the fingers 62 by being seated within notches 76 formed in the exterior thereof. Attachment of the snap ring to the fingers from the outer ends is facilitated by providing tapers 78 on the ends thereof. Since the normal diameter of the socket opening 52 is smaller than that of the lead or prong member 66, the hinges 60 will permit ready expansion of the fingers into conformity with such member and the constricting snap ring 74 will hold the fingers parallel with said member. Such parallel positioning of the fingers is made possible by the compound, accordion-like action of the hinges 60, and the metallic linings 46 afford substantial circuit area to engage lead or prong member 66.

The lead or prong member 66 is insertable into socket opening 52 simply by pushing the same thereinto axially. The frictional engagement of the circuit extensions 46, within the socket opening on some or all of the fingers 62, with the lead or prong member 66 will be accomplished automatically. Withdrawal of members 66 is resisted by such frictional engagement between such members and the circuit extensions 46 on the fingers 62. Further, a snubbing action is afforded by the fact that the ends of the hinge members 60 are connected to board 10 at positions laterally spaced from the members 60, whereby such ends of the connections comprise a fulcrum about which a bending movement will result when incidental or accidental withdrawal is attempted. However, such friction and snubbing action may be overcome by a pull of sufficient force, whereby the electrical component may readily be removed from the board and reconnected as desired, simply and manually.

Returning now to the embodiment of Figures 1–3, rather than using a separate member such as snap ring 74 in the above described embodiment, the arrangement utilizes integrally molded, thin bracing ribs 82 which extend radially between the exterior of fingers 62 and the walls of conical recess 58, as clearly shown in Figure 3 especially. The material from which the board, fingers and ribs is molded being flexible to a limited extent, the fingers 62 may yield radially outwardly sufficiently to permit a member 66 of slightly greater diameter than the normal diameter of socket 52 to be inserted therein and be gripped tightly, thus effecting firm frictional engagement of member 66 with the circuit extensions 46 within the socket. Yielding of the fingers and flexing of hinges 60 is made possible by the thin ribs 82 bowing the required amount as indicated in an exemplary manner in Figure 2 by dotted lines. Even when bowed however, the ribs offer substantial bracing to the fingers 62 over extended periods of time due to the elastic memory of the resin material from which the board is molded which constantly endeavors to restore the ribs to flat condition. Further, the ribs 82 also render the fingers substantially rigid lengthwise, thereby serving in the capacity of ribs 72 in the embodiment shown in Figures 4 through 7.

The use of the types of sockets described herein in the several embodiments to receive prongs or leads of electrical components and establish firm electrical connection of the same with the circuit means within the socket opening is practical, far more easy and less expensive to effect, without injury to the board, sockets, or components, than socket means presently used which require soldering. Also disconnection of a component from the board sockets is far less tedious and is quicker, with no attending injury to other components and sockets, than the unsoldering which must be done when replacing components on conventional boards using soldered connections. The circuits established between the component prongs or leads and the circuit on the board or the portions thereof within the sockets are durable and firm and, for all practical purposes, are comparable, and in many cases superior, to soldered connections.

While the invention has been described and illustrated in its several preferred embodiments, and has included certain details, it should be understood that the invention is not to be limited to the precise details herein illustrated and described since the same may be carried out in other ways falling within the scope of the invention as claimed.

I claim:

1. In a printed circuit panel board of insulating material, a socket opening formed therein defined by a plurality of fingers extending transversely from one surface of said board and circumferentially spaced around the axis of said socket opening, hinge means integral with said board and fingers and extending outwardly from the other surface of the board and then in continuity with one end of the fingers and operable to permit lateral movement of said fingers relative to each other and the axis of said socket opening, and circuit means extending along said board and into said socket, whereby when a prong-like member of greater cross-sectional dimension than the interior of said socket is inserted within said socket for connection to said circuit means the elastic nature of said hinge means permits movement of said fingers radially away from each other to receive said prong-like member between said fingers and tightly engage said member to establish firm contact between said member and the circuit means within said socket.

2. The circuit board panel set forth in claim 1 further characterized by said hinge means being thinner than said fingers.

3. The circuit board panel set forth in claim 1 further characterized by said board having an annular recess extending inward from one surface coaxially with said socket opening, a portion of the surface defining said recess also defining one surface of said hinge means, whereby said hinge means are thinner than said board.

4. In a printed circuit panel board of insulating material, a socket opening therein defined by a plurality of fingers extending transversely to the plane of said board from one surface thereof and circumferentially spaced around the axis of said socket opening, hinge means connecting integrally said board and one end of each finger, said hinge means being substantially U-shaped in cross-section and extending outwardly from the surface of the board and operable to afford accordion-like flexing of the hinge members and permit lateral movement of said fingers relative to each other and the axis of said socket opening while remaining parallel to each other, and circuit means carried by said board and extending into said socket in exposed condition, whereby when a prong-like member of greater cross-sectional dimension than the interior of said socket is inserted into said socket for connection to said circuit means the elastic nature of said hinge means permits movement of said fingers radially away from each other to receive said prong-like member between said fingers and tightly engage said member longitudinally to establish firm contact between said member and the circuit means within said socket.

5. In a printed circuit panel board of insulating material, a socket opening therein outlined by a plurality of fingers extending transversely to the plane of said board from one surface thereof and circumferentially spaced around the axis of said socket opening, said fingers being thinner than said board and having stiffening ribs extending longitudinally of said fingers on the outer surfaces thereof, hinge means integral with said board and fingers and extending outwardly from the other surface of the board and then in continuity with one end of the fingers and operable to permit lateral movement of said fingers relative to each other and the axis of said socket opening, and circuit means extending along said board and into said socket, whereby when a prong-like member of greater cross-sectional dimension than the interior of said socket is inserted within said socket for connection to said circuit means therein the elastic nature of said hinge means permits movement of said fingers radially away from each other to receive said prong-like member between said fingers and tightly engage said member to establish firm contact between said member and the circuit means within said socket.

6. In a printed circuit panel board of insulating material, a projection on one surface of said board and a socket opening extending through said board and said projection transversely to the plane of the board, the walls of said projection being intersected by radial slots extending therethrough from end to end and into said board adjacent said projection to provide a plurality of radially movable fingers connected to said board by integral flexible hinge means, circuit means extending along said board and into said socket, and bracing means comprising relatively thin radial ribs extending between said fingers and board and operable to resist radial outward movement of the outer ends of said fingers being sufficiently flexible to permit limited outward movement of said fingers, whereby when a prong-like member of greater cross-sectional dimension than said socket is inserted thereinto for connection to said circuit means therein said fingers will expand in an essentially parallel fashion radially and the inner surfaces thereof will grip said prong-like member tightly longitudinally and maintain the circuit means within said socket in firm parallel contact with said member.

References Cited in the file of this patent

UNITED STATES PATENTS

| | | |
|---|---|---|
| 1,716,144 | Morrison | June 4, 1929 |
| 2,423,548 | Bels | July 8, 1947 |
| 2,869,040 | Pifer | Jan. 13, 1959 |

FOREIGN PATENTS

| | | |
|---|---|---|
| 637,772 | Great Britain | May 24, 1950 |
| 1,087,104 | France | Aug. 18, 1954 |